United States Patent
Hu et al.

(10) Patent No.: US 11,355,647 B2
(45) Date of Patent: Jun. 7, 2022

(54) THIN FILM TRANSISTOR AND MANUFACTURING METHOD THEREOF AND ELECTRONIC DEVICE

(71) Applicants: Hefei Xinsheng Optoelectronics Technology Co., Ltd., Anhui (CN); BOE Technology Group Co., Ltd., Beijing (CN)

(72) Inventors: Yingbin Hu, Beijing (CN); Ce Zhao, Beijing (CN); Dongfang Wang, Beijing (CN); Bin Zhou, Beijing (CN); Jun Liu, Beijing (CN); Yuankui Ding, Beijing (CN); Wei Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 633 days.

(21) Appl. No.: 16/331,008

(22) PCT Filed: Aug. 17, 2018

(86) PCT No.: PCT/CN2018/101064
§ 371 (c)(1),
(2) Date: Mar. 6, 2019

(87) PCT Pub. No.: WO2019/080617
PCT Pub. Date: May 2, 2019

(65) Prior Publication Data
US 2021/0359140 A1    Nov. 18, 2021

(30) Foreign Application Priority Data
Oct. 25, 2017 (CN) .......................... 201711013990.2

(51) Int. Cl.
*H01L 27/00* (2006.01)
*H01L 29/00* (2006.01)
(Continued)

(52) U.S. Cl.
CPC ...... *H01L 29/78696* (2013.01); *H01L 27/127* (2013.01); *H01L 27/1225* (2013.01);
(Continued)

(58) Field of Classification Search
CPC .............. H01L 27/1225; H01L 27/127; H01L 27/1288; H01L 27/3262; H01L 29/78696;
(Continued)

(56) References Cited

U.S. PATENT DOCUMENTS 7,709,883 B2 *  5/2010  Takano ................ H01L 29/513
                                                      257/324
9,711,653 B2     7/2017  Wang et al.
(Continued)

FOREIGN PATENT DOCUMENTS

CN        103500710 A       1/2014
CN        203932068 U      11/2014
(Continued)

OTHER PUBLICATIONS

Jun. 8, 2021—(EP) Extended European Search Report Appn 18849421.5.
(Continued)

*Primary Examiner* — Nikolay K Yushin
(74) *Attorney, Agent, or Firm* — Banner & Witcoff, Ltd.

(57) ABSTRACT

A thin film transistor includes an active layer, a source electrode and a drain electrode. The active layer includes a conductive region and the conductive region is between the
(Continued)

source electrode and the drain electrode and is spaced apart from at least one of the source electrode and the drain electrode.

19 Claims, 6 Drawing Sheets

(51) Int. Cl.
*H01L 29/786* (2006.01)
*H01L 27/12* (2006.01)
*H01L 29/66* (2006.01)
*G02F 1/1368* (2006.01)
*H01L 27/32* (2006.01)

(52) U.S. Cl.
CPC .... *H01L 27/1288* (2013.01); *H01L 29/66765* (2013.01); *H01L 29/66969* (2013.01); *H01L 29/7869* (2013.01); *H01L 29/78669* (2013.01); *H01L 29/78678* (2013.01); *G02F 1/1368* (2013.01); *H01L 27/3262* (2013.01)

(58) Field of Classification Search
CPC ......... H01L 29/66765; H01L 29/66969; H01L 29/78669; H01L 29/78678; H01L 29/7869; G02F 1/1368; G02F 1/36286; G02F 1/1362; G02F 1/134309; G02F 1/136209; G02F 1/136231; G02F 1/136295
See application file for complete search history.

(56) References Cited

U.S. PATENT DOCUMENTS

| 10,559,601 | B2* | 2/2020 | Su | H01L 27/124 |
| 2004/0201068 | A1 | 10/2004 | Shih | |
| 2006/0001091 | A1* | 1/2006 | Kim | H01L 27/12 |
| | | | | 257/347 |
| 2007/0278563 | A1* | 12/2007 | Takano | H01L 29/513 |
| | | | | 257/324 |
| 2017/0162712 | A1 | 6/2017 | Lu | |
| 2018/0190676 | A1 | 7/2018 | Lv et al. | |
| 2019/0221588 | A1* | 7/2019 | Su | H01L 27/1259 |

FOREIGN PATENT DOCUMENTS

| CN | 105789326 A | | 7/2016 | |
| CN | 201610849162 | * | 9/2016 | ......... H01L 27/1233 |
| CN | 106601621 A | | 4/2017 | |
| EP | 3188252 A1 | | 7/2017 | |
| KR | 101185165 B1 | | 9/2012 | |
| WO | 2009000136 A1 | | 12/2008 | |
| WO | 2013027716 A1 | | 2/2013 | |

OTHER PUBLICATIONS

Nov. 1, 2018—(WO) International Search Report and Written Opinion Appn PCT/CN2018/101064 with English Translation.

* cited by examiner

THIN FILM TRANSISTOR AND MANUFACTURING METHOD THEREOF AND ELECTRONIC DEVICE The application is a U.S. National Phase Entry of International Application No. PCT/CN2018/101064 filed on Aug. 17, 2018, designating the United States of America and claiming priority to Chinese Patent Application No. 201711013990.2, filed on Oct. 25, 2017. The present application claims priority to and the benefit of the above-identified applications and the above-identified applications are incorporated by reference herein in their entirety.

TECHNICAL FIELD

Embodiments of the present disclosure relate to a thin film transistor and a manufacturing method thereof and an electronic device.

BACKGROUND

A display device of an active matrix (AM) type becomes a mainstream product of the current display devices due to its advantages such as high resolution, rapid response speed and high contrast and the like, which comprises an organic light-emitting diode (OLED) display device, a liquid crystal display device (LCD) and the like. A thin film transistor (TFT) is an important element in the active matrix display device, which can function as a switching element or a driving element. A structure and a manufacturing process of the thin film transistor both exert a great influence on the performance of the display device.

SUMMARY

Embodiments of the present disclosure provide a thin film transistor, comprising: an active layer, a source electrode and a drain electrode. The active layer comprises a conductive region, and the conductive region is between the source electrode and the drain electrode and is spaced apart from at least one of the source electrode and the drain electrode.

For example, the conductive region is spaced apart from both the source electrode and the drain electrode.

For example, the conductive region is directly connected with the source electrode and a channel region is between the conductive region and the drain electrode; or the conductive region is directly connected with the drain electrode and a channel region is between the conductive region and the source electrode.

For example, the conductive region runs through the active layer in a thickness direction of the active layer.

For example, the thin film transistor is in a top-gate structure or a bottom-gate structure.

For example, the thin film transistor comprises a back channel etching structure and the conductive region corresponds to a surface of the back channel etching structure.

For example, a material of the active layer is a metal oxide semiconductor material, an amorphous silicon material or a polysilicon material.

For example, the metal oxide semiconductor material comprises indium gallium zinc oxide (IGZO), indium zinc oxide (IZO), zinc oxide (ZnO) or gallium zinc oxide (GZO).

Embodiments of the present disclosure further provide an array substrate, comprising the above mentioned thin film transistor.

Embodiments of the present disclosure further provide an electronic device, comprising the above mentioned thin film transistor or array substrate.

For example, the electronic device is a liquid crystal display device, an organic light emitting diode display device or an e-paper display device.

Embodiments of the present disclosure further provide a manufacturing method of a thin film transistor, comprising: forming an active layer, a source electrode and a drain electrode; and performing a conduction treatment on a portion of the active layer to allow the portion to become a conductive region. The conductive region is formed between the source electrode and the drain electrode and is spaced apart from at least one of the source electrode and the drain electrode.

For example, the conduction treatment comprises: forming a mask layer with an opening on the active layer, the opening exposing at least a portion of the active layer; and performing the conduction treatment on the active layer using the mask layer.

For example, a source-drain electrode layer is formed after forming the active layer and before forming the mask layer, and a patterning process is performed on the source-drain electrode layer to form the source electrode and the drain electrode.

For example, the conduction treatment comprises performing a plasma treatment on the active layer.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
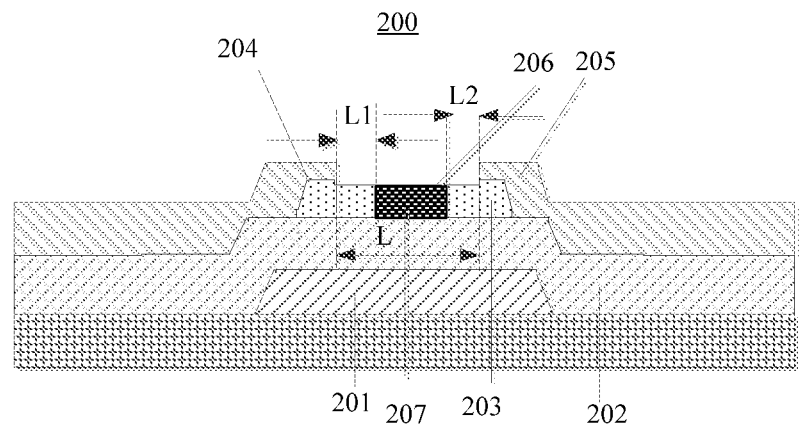
FIG. 1 is a schematic sectional view of a thin film transistor provided by an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

In the middle of the twentieth century, oxide ZnO thin film transistor (TFT) was extensively researched but not widely applied due to limitations of itself. Until 2003, indium gallium zinc oxide thin film transistors (IGZO TFT) attracted great attentions for outstanding performances. From then, oxide thin film transistor technologies have entered into a rapid development phase. A metal oxide thin film transistor adopts a metal oxide semiconductor material as the active layer to provide a channel. These materials mainly comprise n-type semiconductor materials based on zinc oxide and/or indium oxide and the like, such as zinc oxide (ZnO), indium oxide (In2O3), zinc indium oxide (IZO), aluminum doped zinc oxide (AZO), boron doped zinc oxide (BZO), magnesium doped zinc oxide (MZO), zinc tin oxide (ZTO), indium gallium zinc oxide (IGZO), indium tin zinc oxide (ITZO), gallium zinc oxide (GZO), indium tin oxide (ITO), hafnium indium zinc oxide (HIZO), tin oxide (SnO2) and the like; and p-type semiconductor materials such as stannous oxide (SnO), cuprous oxide (Cu2O) and the like. Compared to a silicon-based (amorphous silicon, polysilicon and the like) thin film transistor, the metal oxide thin film transistor has obvious advantages mainly including a higher mobility, a steeper sub-threshold swing, a smaller off-state leakage current, a better uniformity in device performance, a simple process, a low process temperature, a good stability, a high light transmittance, no obvious degradation in device performance in a curved state and the like.

During a manufacturing process of an amorphous silicon thin film transistor, a common source-drain etching solution or gas does little etching damage to an active region of the amorphous silicon and a performance of the device barely degrades before and after the source-drain is etched, so a photolithography process may be directly adopted for an amorphous silicon thin film transistor to form a source-drain electrode and a wiring layer and the like above the active region, which is called a back-channel etching (BCE) process and can achieve aims such as simplifying process, reducing cost and the like. However, for an oxide thin film transistor represented by indium gallium zinc oxide thin film transistor, the oxide semiconductor layer is very sensitive to acidic or alkaline etching solution and gas. If a back-channel etching process similar to the amorphous silicon thin film transistor process is adopted to manufacture the oxide thin film transistor, a back interface characteristics of the active region of the oxide thin film transistor may be damaged by the source-drain etching solution or gas and the performance of the device degrades obviously.

A back channel etch-stop layer (ESL) process may be used to solve the problem that a device characteristic is influenced by the source-drain etching process. Although the process can bring an obvious improvement to the device characteristic, additional deposition, photolithography and etching steps are required to form the etch-stop layer, which obviously increase process complexity and cost. Therefore, if the etch-stop layer process is adopted to form the oxide thin film transistor, cost can be obviously higher than that of an oxide thin film transistor or an amorphous silicon thin film transistor made by the back-channel etching process.

Embodiments of the present disclosure provide a thin film transistor and a manufacturing method thereof and an electronic device. The thin film transistor provides a conductive region in a portion, which is between the source electrode and the drain electrode, of the active layer of the thin film transistor, so as not only to improve an interface performance of the thin film transistor, but also to decrease a channel length of the thin film transistor. In this way, an on-state current is increased.

Specific embodiments of the present disclosure are described below in connection with the figures so as to make the present disclosure better understood.

FIG. 1 is a schematic sectional view of a thin film transistor 200 provided by an embodiment of the present disclosure. The thin film transistor is in a bottom-gate structure, a back channel etching structure for example. The thin film transistor 200 comprises a gate electrode 201, a gate insulating layer 202, an active layer 203 and a source-drain electrode layer (comprising a source electrode 204 and a drain electrode 205) which are sequentially stacked on a substrate. The active layer 203 comprises a surface 206 and the surface is in direct electrical contact with the source electrode 203 and the drain electrode 205. The surface may be a flat plane or comprise a concave surface portion. The concave surface portion is formed through an over-etching of the active layer 203 while forming the source-drain electrode layer with the back channel etching process, which is however not limited to the embodiment. The active layer 203 comprises a conductive region 207, and the conductive region 207 is located between the source electrode 204 and the drain electrode 205 and is spaced apart from at least one of the source electrode 204 and the drain electrode 205. For example, as illustrated in the figure, the conductive region is spaced apart from both the source electrode 204 and the drain electrode 205. For example, the conductive region 207 runs through the active layer 203 in a thickness direction of the active layer. In this embodiment, the active layer of the thin film transistor 200 comprises two portions: a first channel region between the source electrode 204 and the conductive region 207, a length of which is L1; and a second channel region between the conductive region 207 and the drain electrode 205, a length of which is L2. Because of a provision of the conductive region 207, a channel length of the thin film transistor 200 is shortened from L to L1+L2.

An on-current Ion of a thin film transistor Ion is positively proportional to a ratio of channel width W to channel length L of the thin film transistor. For example, in a case that the thin film transistor works in a saturation region, a calculation formula of the on-current Ion is as follows:

$$I_{on} = \frac{1}{2}\mu_n C_{ox} \frac{W}{L}(V_{gs} - V_{th})^2$$

As can be seen, a value of Ion is positively proportional to the channel width W and is negatively proportional to the channel length L, so that a decrease in the channel length L of the thin film transistor can effectively increase the on-current of the thin film transistor.

In this embodiment, at least two technical benefits are achieved by providing of the conductive region 207: alleviating an interface characteristic degradation problem of the back channel etching surface of the active layer caused by over-etching, and decreasing the channel length of the thin film transistor 200 so as to increase the on-current of the thin film transistor.

Figure 2:
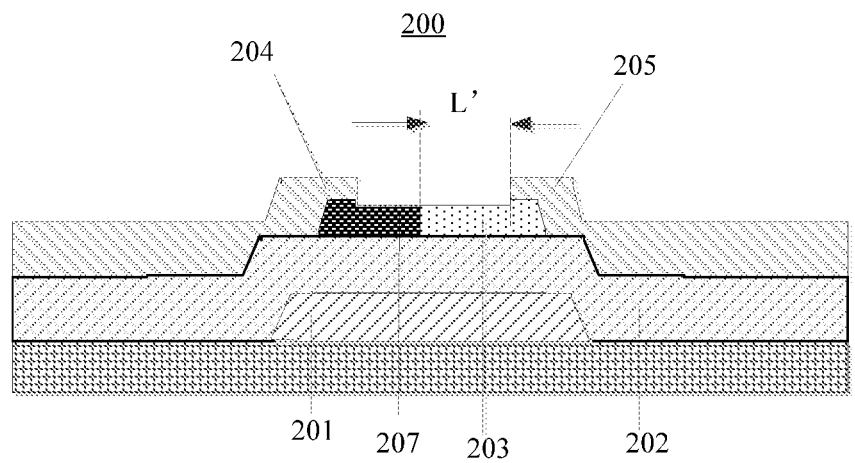
FIG. 2 is a schematic sectional view of a thin film transistor provided by a modified embodiment of the present disclosure.

In a modified embodiment, for example, as illustrated in FIG. 2, the conductive region 207 may be directly connected with the source electrode 204 and is only spaced apart from the drain electrode 205. In this situation, the channel length of the thin film transistor is L'. Or, the conductive region 207 is directly connected with the drain electrode 205 and is only spaced apart from the source electrode 204.

Figure 3:
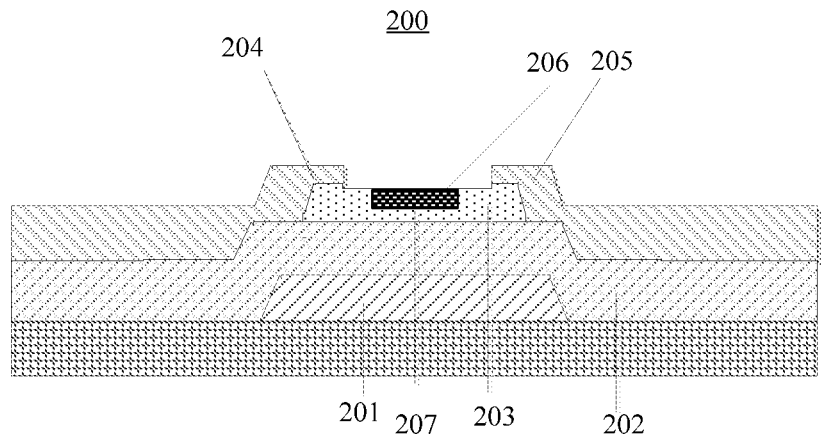
FIG. 3 is a schematic sectional view of a thin film transistor provided by another modified embodiment of the present disclosure.

In a modified embodiment, for example, as illustrated in FIG. 3, the conductive region 207 may be a surface portion, which is close to a side of the source-drain electrode layer, of the active layer 203, that is, the conductive region 207 does not run through the active layer 203 in the thickness direction of the active layer 203.

For example, a material of the active layer may be a metal oxide semiconductor material, an amorphous silicon material, a polysilicon material or the like.

For example, the material of the active layer 203 may be indium gallium zinc oxide (IGZO), indium zinc oxide (IZO), zinc oxide (ZnO) or gallium zinc oxide (GZO) and the like. The polysilicon material may be high-temperature or low-temperature polysilicon or the like.

Figure 4:
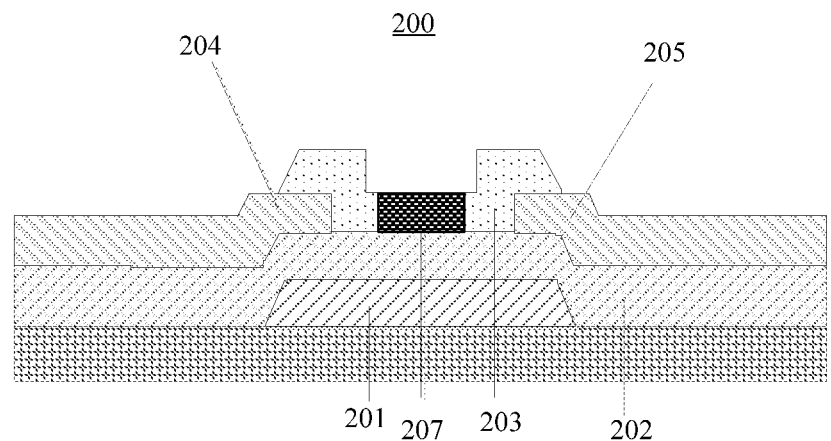
FIG. 4 is a schematic sectional view of a thin film transistor provided by still another modified embodiment of the present disclosure.

In a modified embodiment, for example, the thin film transistor 200 may be in other bottom-gate structures. As illustrated in FIG. 4, the source-drain electrode layer (comprising the source electrode 204 and the drain electrode 205) and the gate electrode 201 of the thin film transistor are located on a same side of the active layer 203.

Figure 5:
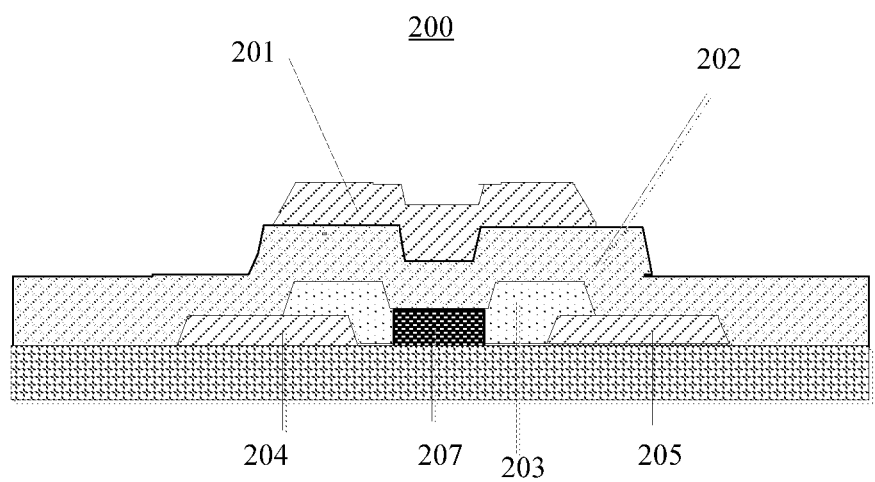
FIG. 5 is a schematic sectional view of a thin film transistor provided by still further another modified embodiment of the present disclosure.

In a modified embodiment, for example, the thin film transistor 200 may be in a top-gate structure. As illustrated in FIG. 5, the thin film transistor 200 comprises a source-drain electrode layer (comprising a source electrode 204 and a drain electrode 205), an active layer 203, a gate insulating layer 202 and a gate electrode 201 which are sequentially stacked on a substrate.

Embodiments of the present disclosure further provide a manufacturing method of a thin film transistor, which may be used for manufacturing the thin film transistor of the above-mentioned embodiments. The method at least comprises: forming an active layer, a source electrode and a drain electrode; and performing a conducting treatment on a portion of the active layer to allow the portion to become a conductive region, wherein the conductive region is formed between the source electrode and the drain electrode and is spaced apart from at least one of the source electrode and the drain electrode.

FIGS. 6A-6D are schematic sectional views of steps of a method for manufacturing a thin film transistor provided by an embodiment of the present disclosure. For the bottom-gate thin film transistor as illustrated in FIG. 1, the method comprises the following steps:

Step S61, forming the gate electrode 201.

Figure 6A:
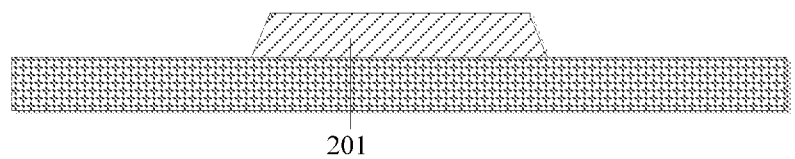
FIGS. 6A-6D are schematic sectional views of steps of a method for manufacturing a thin film transistor provided by an embodiment of the present disclosure.

As illustrated in FIG. 6A, a substrate is firstly provided to form the thin film transistor thereon. The substrate may be exemplarily a glass substrate, a plastic substrate and the like. A cleaning operation and the like may be performed to the substrate firstly, and a buffer layer may also be formed on the substrate and then the thin film transistor is formed on the buffer layer. The buffer layer can prevent impurity ions in the substrate from diffusing into the thin film transistor and therefor causing a performance of the thin film transistor to decrease. A first conductive layer is formed on the substrate and a first patterning process is performed on the first conductive layer to pattern the first conductive layer to form the gate electrode 201. The first conductive layer is a metal layer for example, a material of which may be aluminum or aluminum alloy, copper or copper alloy or the like.

Additionally, the substrate may be a bendable flexible substrate, for example, a substrate made of various kinds of plastic films such as polyethylene terephthalate (PET), polyether sulfone (PES), polycarbonate (PC) polyimide (PI) or derivative of the above.

Step S62, forming the gate insulating layer 202 and the active layer 203.

Figure 6B:
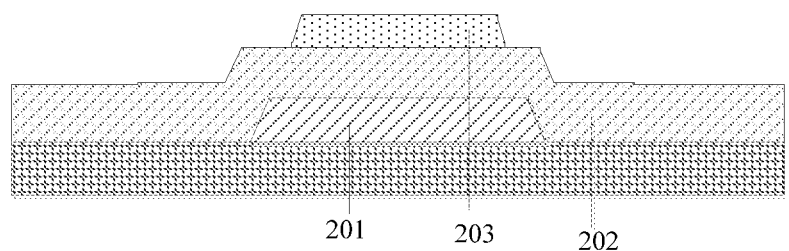

As illustrated in FIG. 6B, the gate insulating layer 202 is formed on the gate electrode 201, subsequently a semiconductor layer is formed on the gate insulating layer 202, and the active layer 203 is formed using a second patterning process to pattern the semiconductor layer.

A material of the active layer 203 may be a semiconductor material such as a metal oxide semiconductor material, an amorphous silicon material, a polysilicon material and the like. For example, the material of the active layer 203 may be metal oxide semiconductor materials such as indium gallium zinc oxide (IGZO), indium zinc oxide (IZO), zinc oxide (ZnO) or gallium zinc oxide (GZO). The polysilicon material may be high-temperature or low-temperature polysilicon. A material of the gate insulating layer may be an inorganic insulating layer such as silicon oxide, silicon nitride, silicon oxynitride and the like.

Step S63, forming the source electrode 204 and the drain electrode 205.

Figure 6C:
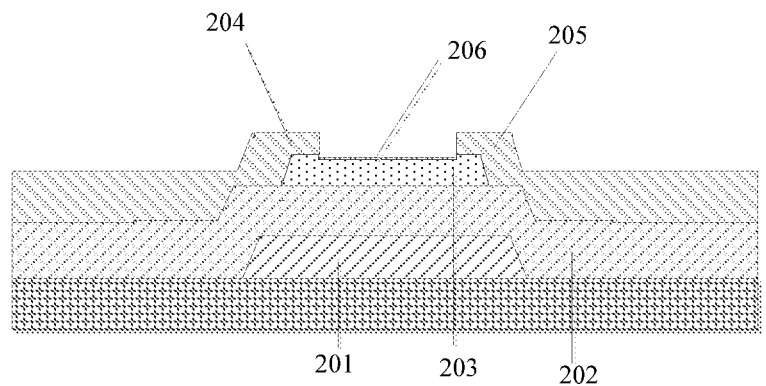

As illustrated in FIG. 6C, a second conductive layer is formed on the active layer 203, and a third patterning process is used to pattern the second conductive layer to form the source electrode 204 and the drain electrode 205. The second conductive layer may be exemplarily selected from metal materials such as molybdenum, titanium, copper and alloy of them.

The third patterning process may be a photolithography process comprising exposure, development and etching and the like. During the process of etching the second conductive layer to form the source electrode and the drain electrode which are spaced apart from each other at a predetermined distance so as to be insulated from each other, in order to prevent a short circuit from occurring between the source electrode and the drain electrode due to a halfway etching, an over-etching is usually performed to etch away a portion of a back surface of the active layer 203, so that a concave surface 206 is formed in the back surface of the active layer 203. Because a material of the active layer 203 is sensitive to the etching gases or solutions, a semiconductor characteristic of the active layer 203 at the concave surface is adversely affected, and non-uniform etching, interface defects and the like may be formed for example.

Step S64, forming the conductive region 207.

Figure 6D:
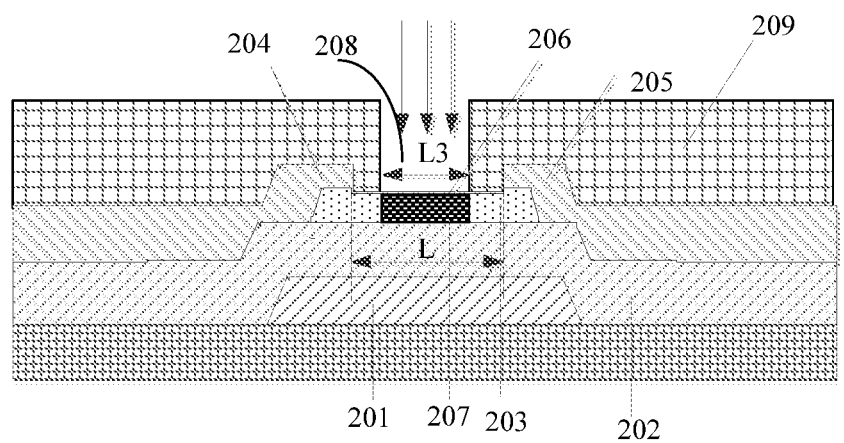

As illustrated in FIG. 6D, a photoresist layer is formed on the source electrode 204 and the drain electrode 205, which covers the source electrode 204 and the drain electrode 205. The photoresist layer is exposed and developed to form a mask layer 209 with an opening 208. In this embodiment, the opening 208 is disposed to correspond to a portion between the source electrode 204 and the drain electrode 205 and to expose at least a portion of the active layer 203. As illustrated in the figure, the source electrode 204 and the drain electrode 205 are both covered by the mask layer 209, that is, not exposed by the opening 208. Because a location of the opening 208 such as a distance between the opening 208 and the source electrode 204 and the drain electrode 205 is not precisely required by the embodiment of the present disclosure, a requirement for an exposure process precision in this step is low, and the opening 208 is only needed to be formed to correspond to a portion between the source electrode 204 and the drain electrode 205. A distance between the source electrode 204 and the drain electrode 205 is defined as L, a size of the opening 208 is L3, and a value range of L3 may be 0<L3<L for example.

Subsequently, the mask layer 209 is used to perform a conduction process to the active layer 203 to form the conductive region 207. For example, the conductive region 207 is spaced apart from both the source electrode 204 and the drain electrode 205. In this embodiment, a manner of the conduction process may be selected according to a material of the active layer, exemplarily comprising a plasma treatment to the active layer 203. In this embodiment, the conductive region 207 runs through the active layer in a thickness direction of the active layer 203. In other embodiments, condition parameters such as a gas concentration, a process time, a power and the like used during the plasma treatment may be controlled, so as to allow the conductive region 207 to be only a surface portion, which is close to a side of the source-drain electrode layer, of the active layer 203, and not to run through the active layer 203 in the thickness direction of the active layer. An off-current is usually smaller in this type of structure.

In this embodiment, the channel region of the thin film transistor 200 comprises two portions: a first channel region between the source electrode 204 and the conductive region 207, of which a length is L1; and a second channel region between the conductive region 207 and the drain electrode 205, of which a length is L2. Because of a formation of the conductive region 207, a channel length of the thin film transistor 200 is shortened from L without the conductive region 207 to L1+L2 with the conductive region 207.

For example, for an indium gallium zinc oxide (IGZO) active layer, there are two ways to perform a conduction process on the active layer 203 through the plasma treatment: increasing a hydrogen concentration of the active layer, or reducing an oxygen concentration of the active layer.

For example, gases for forming the plasma comprise gases containing hydrogen elements, such as hydrogen gas (H2), ammonia gas (NH3), silane (SiH4). These gases are ionized into hydrogen ions which enter into the active layer during the plasma treatment, so that the hydrogen concentration of the active layer is increased and a conductivity of the active layer is improved.

For example, gases for forming the plasma comprise inert gases with an atom radius smaller than an oxygen ion radius, such as helium gas. The oxygen concentration of the active layer can be reduced by bombarding the oxygen ions in the active layer using the helium atoms, so as to improve the conductivity of the active layer.

The mask layer 209 is removed finally, so as to form the thin film transistor 200 with the back channel etching structure as illustrated in FIG. 1.

Figure 7:
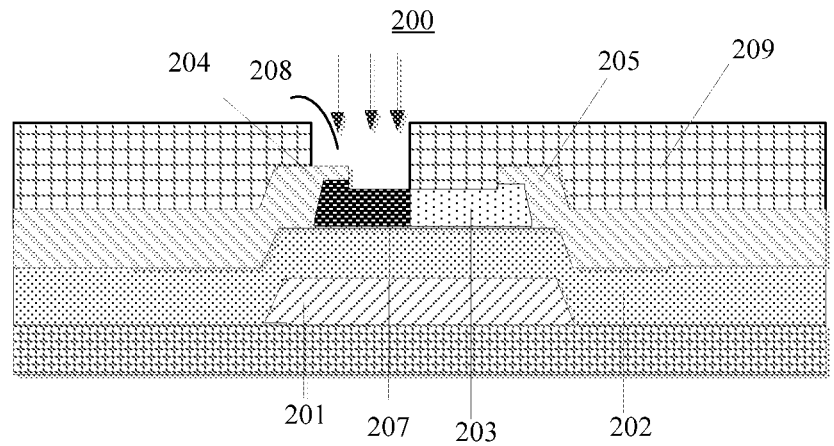
FIG. 7 is a schematic sectional view of steps of a method for manufacturing a thin film transistor provided by a modified embodiment of the present disclosure.

In a modified embodiment, the opening 208 of the mask layer 209 exposes at least a portion of one of the source electrode 204 and the drain electrode 205. For example, as illustrated in FIG. 7, the opening 208 exposes at least a portion of the source electrode 204. In this situation, the conductive region 207 is directly connected with the source electrode 204, so that the thin film transistor 200 as illustrated in FIG. 2 is formed. In this embodiment, a requirement for a precision of the size L3 of the opening 208 is lower, and it is only needed to ensure that one of the source electrode and the drain electrode is exposed through the opening and the other is not exposed through the opening.

In this embodiment and the modified embodiment thereof, at least two technical benefits are achieved by providing the conductive region in the active layer of the thin film transistor: alleviating an interface characteristic degradation problem of the back channel etching surface of the active layer caused by over-etching, and decreasing the channel length of the thin film transistor 200 so as to increase the on-current of the thin film transistor.

Figure 8A:
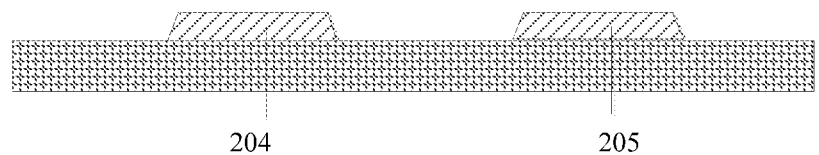
FIGS. 8A-8C are schematic sectional views of steps of a method for manufacturing a thin film transistor provided by another embodiment of the present disclosure.
Figure 8B:
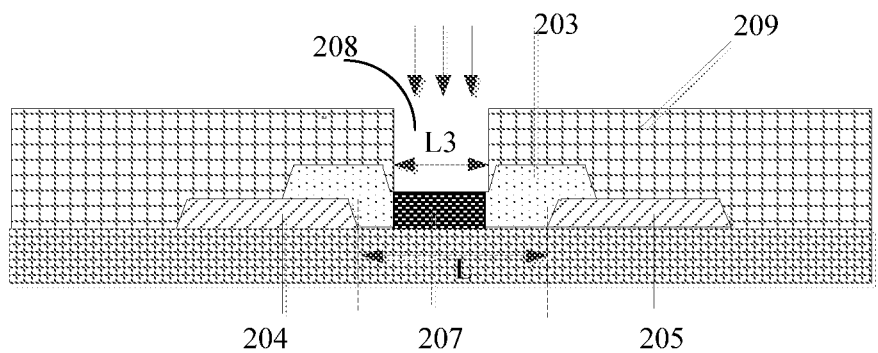
Figure 8C:
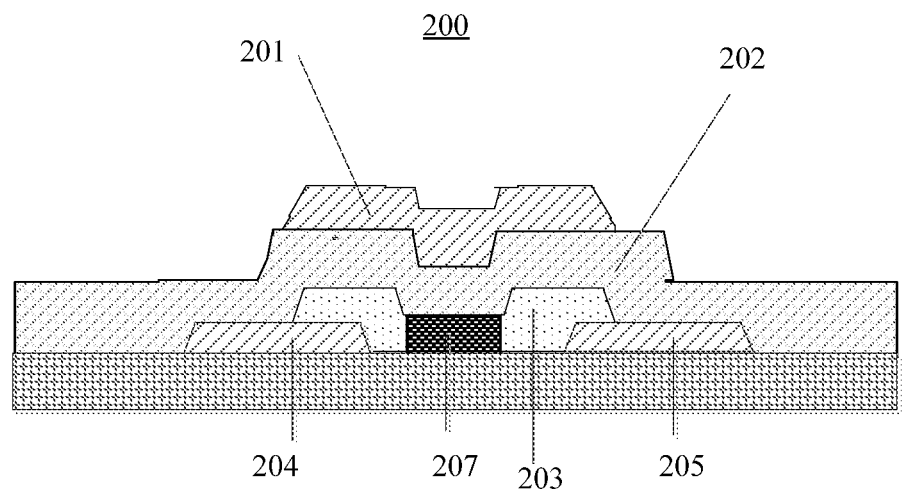

FIGS. 8A-8C are schematic sectional views of steps of a method for manufacturing a thin film transistor provided by another embodiment of the present disclosure. For the top-gate thin film transistor as illustrated in FIG. 5, the method comprises the following steps:

Step S81, forming the source electrode 204 and the drain electrode 205.

As illustrated in FIG. 8A, a substrate is firstly provided to form the thin film transistor thereon. The substrate may be exemplarily a rigid substrate or a flexible substrate, may be a glass substrate, a plastic substrate and the like. A first conductive layer is formed on the substrate and a first patterning process is performed on the first conductive layer to pattern the first conductive layer to form the source electrode 204 and the drain electrode 205. The first patterning process may be a photolithography process comprising exposure, development and etching and the like. The first conductive layer may be exemplarily selected from materials such as molybdenum, titanium, aluminum, copper and alloy of them.

Step S82, forming the active layer 203 and the conductive region 207 of the active layer 203.

As illustrated in FIG. 8B, a semiconductor layer is formed on the source electrode 204 and the drain electrode 205, and the active layer 203 is formed by using a second patterning process to pattern the second semiconductor layer.

A material of the active layer 203 may be a semiconductor material such as a metal oxide semiconductor material, an amorphous silicon material, a polysilicon material or the like. For example, the material of the active layer 203 may be metal oxide semiconductor materials such as indium gallium zinc oxide (IGZO), indium zinc oxide (IZO), zinc oxide (ZnO) or gallium zinc oxide (GZO) and the like.

Subsequently, a photoresist layer is formed on the source electrode 204 and the drain electrode 205. The photoresist layer is exposed and developed to form a mask layer 209 with an opening 208. In this embodiment, the opening 208 is disposed to correspond to a portion between the source electrode 204 and the drain electrode 205. A location of the opening 208 such as a distance between the opening 208 and the source electrode 204 and the drain electrode 205 may be not precisely required by the embodiment of the present disclosure, a requirement for an exposure process precision in this step is low, and the opening 208 is only needed to be formed corresponding between the source electrode 204 and the drain electrode 205. A distance between the source electrode 204 and the drain electrode 205 is defined as L, a size of the opening 208 is L3, and a value range of L3 may be 0<L3<L for example.

Subsequently, the mask layer 209 is used to perform a conduction process to the active layer 203 to form the conductive region 207. The conductive region 207 is spaced apart from both the source electrode 204 and the drain electrode 205, and the conductive region 207 runs through the active layer in a thickness direction of the active layer 203.

The channel region of the obtained thin film transistor 200 comprises two portions: a first channel region between the source electrode 204 and the conductive region 207, of which a length is L1; and a second channel region between the conductive region 207 and the drain electrode 205, of which a length is L2. Because of a formation of the conductive region 207, a channel length of the thin film transistor 200 is shortened from L without the conductive region 207 to L1+L2 with the conductive region 207.

For example, for an indium gallium zinc oxide (IGZO) active layer, there are two ways to perform a conduction process on the active layer 203 through the plasma treatment: increasing a hydrogen concentration of the active layer, or reducing an oxygen concentration of the active layer.

For example, gases for forming the plasma comprise gases containing hydrogen elements, such as hydrogen gas (H2), ammonia gas (NH3), silane (SiH4). These gases are ionized into hydrogen ions which enter into the active layer during the plasma treatment, so that the hydrogen concentration of the active layer is increased and a conductivity of the active layer is improved.

For example, gases for forming the plasma comprise inert gases, of which an atom radius is smaller than an oxygen ion radius, such as helium gas. The oxygen concentration of the active layer can be reduced by bombarding the oxygen ions in the active layer using the helium atoms, so as to improve the conductivity of the active layer.

The mask layer 209 is removed after forming the conductive region 207.

Step S83: forming the gate insulating layer 202 and the gate electrode 201.

As illustrated in FIG. 8C, the gate insulating layer 202 is formed on the active layer 203, a second conductive layer is formed on the gate insulating layer 202, and a third pattering process is used to pattern the second conductive layer to form the gate electrode 202. A material of the gate insulating layer may be an inorganic insulating layer such as silicon oxide, silicon nitride, silicon oxynitride and the like. The second conductive layer may be exemplarily selected from materials such as molybdenum, titanium, aluminum, copper and alloy of them.

So far, the top-gate thin film transistor 200 with a top-gate structure as illustrated in FIG. 5 is formed.

Figure 9A:
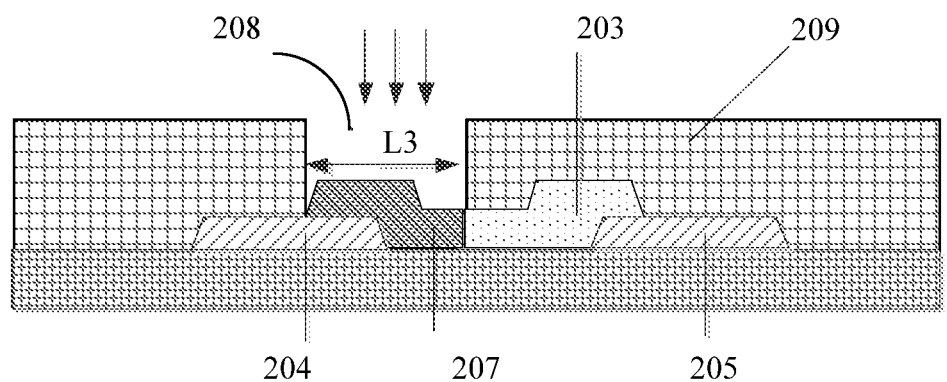
FIGS. 9A-9B are schematic sectional views of steps of a method for manufacturing a thin film transistor provided by a modified embodiment of the present disclosure.
Figure 9B:
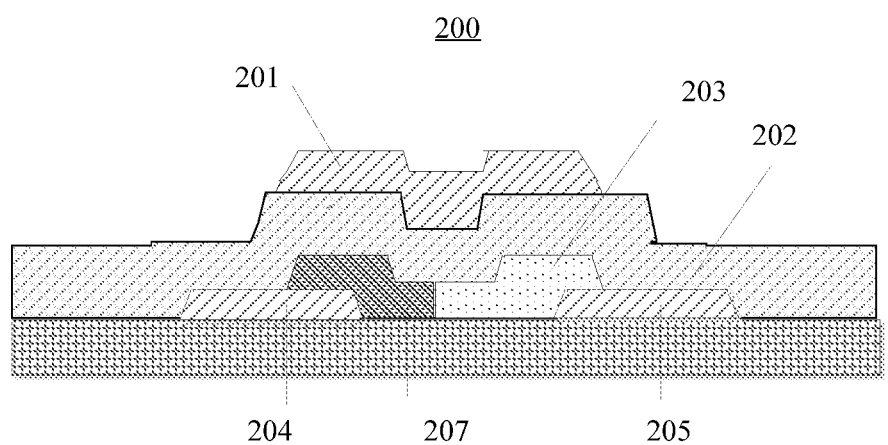

In a modified embodiment, a projection of the opening 208 of the mask layer 209 on the substrate is at least partially overlapped with a projection of one of the source electrode 204 and the drain electrode 205 on the substrate. As illustrated in FIG. 9A, the projection of the opening 208 of the mask layer 209 on the substrate is partially overlapped with the projection of the source electrode 204 on the substrate. The conductive region 207 formed in this situation is directly connected with the source electrode 204, so that the thin film transistor 200 as illustrated in FIG. 9B is formed.

In this embodiment and the modified embodiment thereof, the conductive region is formed in the active layer of the thin film transistor, so that the channel length of the thin film transistor is reduced and thereby the on-current of the thin film transistor is increased.

Similarly, a top-gate or bottom-gate thin film transistor with other structures may be formed, which is not repeated here.

Embodiments of the present disclosure further provide an array substrate and the array substrate may be applied in a liquid crystal display device, an organic light-emitting diode display device or an e-paper display device and the like. The array substrate may comprise the thin film transistor according to any one embodiment of the present disclosure.

The array substrate of the embodiment comprises a plurality of gate lines and a plurality of data lines. These gate lines and data lines intersect with each other, thereby defining pixel units arranged in an array. Each pixel unit comprises a thin film transistor functioning as a switch element and a pixel electrode connected with the thin film transistor. For example, a gate electrode of the thin film transistor of each pixel is electrically connected with a corresponding gate line or is formed integrally with the corresponding gate line, and a drain electrode is electrically connected with a corresponding data line or is formed integrally with the corresponding data line. The thin film transistor may adopt the thin film transistor according to any one embodiment of the present disclosure.

For the array substrate applied in the liquid crystal display device, the pixel electrode of each pixel unit is configured to apply an electric field to control a rotation degree of liquid crystal molecules so as to achieve the display. For the array substrate applied in the organic light-emitting diode display device, the pixel electrode of each pixel unit functions as an anode or a cathode to drive an organic light-emitting material to emit light so as to achieve the display. For the array substrate applied in the e-paper display device, the pixel electrode of each pixel unit is configured to apply a voltage to drive charged particles in electronic ink to move so as to achieve the display.

Figure 10:
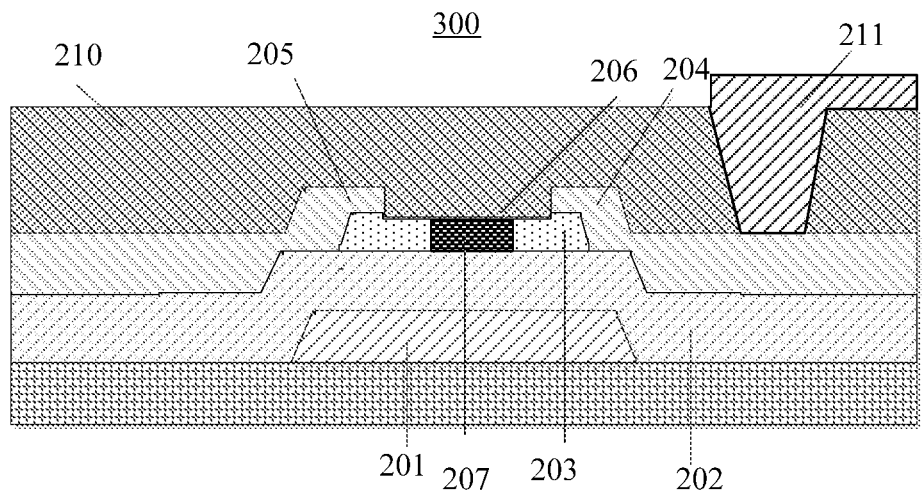
FIG. 10 is a schematic view of an array substrate provided by an embodiment of the present disclosure.

As illustrated in FIG. 10, the array substrate 300 comprises the thin film transistor 200 as illustrated in FIG. 1, and further comprises a planarization layer or a passivation layer 201 on the thin film transistor. The pixel electrode 211 is connected with the source electrode 204 through a through hole running through the planarization layer or the passivation layer. The drain electrode 205 of the thin film transistor is connected with the data line (not shown). The thin film transistor functions as a switch element, controlling a signal transmission between the data line and the pixel electrode 211.

Embodiments of the present disclosure further provide an electronic device 400, and the electronic device comprises the thin film transistor 200 according to any one embodiment of the present disclosure or the above-mentioned array substrate 300. For example, the electronic device is a display device such as a liquid crystal display device, an organic light-emitting diode display device and an e-paper display device. For example, a pixel unit of the display device comprises the thin film transistor 200. Or, for example, a driving circuit of the display device comprises the thin film transistor 200.

The thin film transistor of the above mentioned pixel unit or driving circuit (i.e. GOA) may be formed on the array substrate and the thin film transistor may adopt the thin film transistor of any one embodiment of the present disclosure.

Figure 11:
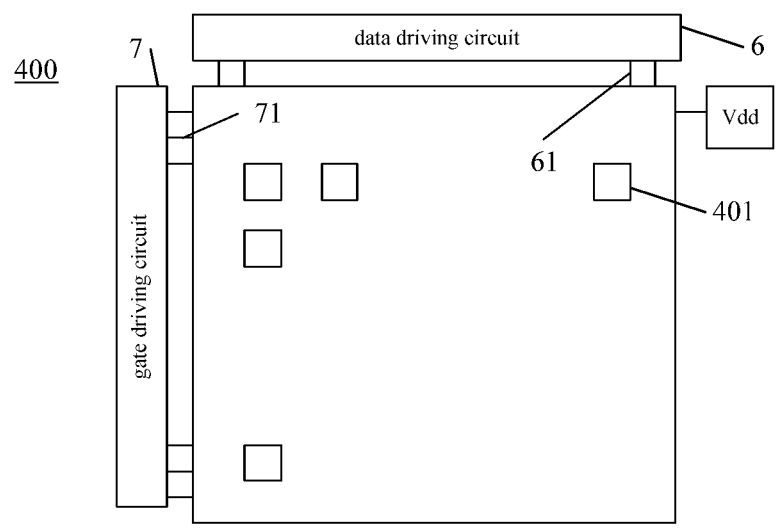
FIG. 11 is a schematic view of an electronic device provided by an embodiment of the present disclosure.
Figure 12:
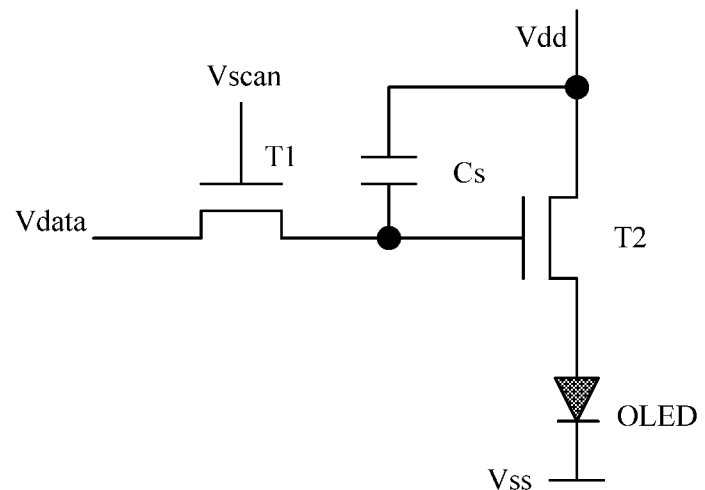
FIG. 12 is a schematic view of a 2T1C pixel circuit of the electronic device in FIG. 11.

FIG. 11 is a schematic diagram of an electronic device 400 provided by an embodiment of the present disclosure and FIG. 12 is schematic view of a pixel circuit of the electronic device of FIG. 11. Referring to FIG. 11 in combination with FIG. 12, the electronic device 400 is an organic light-emitting diode display device. The organic light-emitting diode display device comprises a plurality of pixel units 401 arranged in an array, each pixel unit 401 comprises at least one organic light-emitting diode and a pixel circuit connected with the organic light-emitting diode, and the organic light-emitting diode is driven to emit light by the pixel circuit.

FIG. 12 is a schematic view of a 2T1C pixel circuit of an organic light-emitting diode electronic device. The pixel circuit comprises a switch transistor T1, a driving transistor T2 and a storage capacitor Cs. A gate electrode of the switch transistor T1 is connected with a gate line to receive a scan signal (Scan), a source electrode is connected with a data line to receive a data signal (Vdata) for example, and a drain electrode is connected with a gate electrode of the driving transistor T2. A source electrode of the driving transistor T2 is connected with a first power source terminal (Vdd, a high voltage terminal) and a drain electrode is connected with a positive end of OLED. One end of the storage capacitor Cs is connected with the drain electrode of the switch transistor T1 and the gate electrode of the driving transistor T2, and the other end is connected with the source electrode of the driving transistor T2 and the first power source terminal. A negative end of the OLED is connected with a second power source terminal (Vss, a low voltage end), for example, is grounded. A driving manner of the 2T1C pixel circuit is to control bright and dark (a greyscale) of a pixel by two TFTs and a storage capacitor Cs. When the scan signal Scan is applied by the gate line to turn on the switch transistor T1, the data voltage (Vdata) which is sent through the data line by a data driving circuit charges the storage capacitor Cs through the switch transistor T1, so as to store the data voltage in the storage capacitor Cs. The stored data voltage controls a conduction degree of the driving transistor T2 so as to control a current value of current which runs through the driving transistor to drive the OLED to emit light; that is, the current determines an emission greyscale of the OLED. In the 2T1C pixel circuit as illustrated in FIG. 12, the switch transistor T1 and the driving transistor T2 both may adopt the thin film transistor 200 of the embodiments of the present disclosure for example.

As illustrated in FIG. 11, the organic light-emitting diode display device may further comprise a data driving circuit 6 and a gate driving circuit 7. The data driving circuit 6 is configured to provide a data signal and the gate driving circuit 7 is configured to provide a scan signal (e. g. the signal Vscan) and may be further configured to provide various kinds of control signals. The data driving circuit 6 is electrically connected with the pixel unit 401 through the data line 61, and the gate driving circuit 7 is electrically connected with the pixel unit 401 through the gate line 71. The data driving circuit 6 and the gate driving circuit 7 both comprises a thin film transistor which may adopt the thin film transistor 200 of the embodiments of the present disclosure for example.

For example, the display device may be applied in any product or component having display functions such as a cellphone, a tablet computer, a television, a displayer, a notebook computer, a digital photo frame, a navigator and the like.

What are described above is related to the illustrative embodiments of the disclosure only and not limitative to the scope of the disclosure; the scopes of the disclosure are defined by the accompanying claims.

The application claims priority to the Chinese patent application No. 201711013990.2, filed on Oct. 25, 2017, the entire disclosure of which is incorporated herein by reference as part of the present application.

What is claimed is:

1. A thin film transistor, comprising an active layer, a source electrode, and a drain electrode,
   wherein the active layer comprises a conductive region, and the conductive region is between the source electrode and the drain electrode and is spaced apart from at least one of the source electrode and the drain electrode.
   the active layer comprises a concave surface close to a side of the source electrode and the drain electrode, and
   the concave surface is at least partially overlapped with the conductive region in a direction perpendicular to a plane in which the active layer is located.

2. The thin film transistor according to claim 1, wherein the conductive region is spaced apart from both the source electrode and the drain electrode.

3. The thin film transistor according to claim 1, wherein the conductive region runs through the active layer in a thickness direction of the active layer.

4. An array substrate, comprising the thin film transistor according to claim 1.

5. The thin film transistor according to claim 1, wherein the conductive region is a surface portion of the active layer, and
   the conductive region does not run through the active layer in a thickness direction of the active layer.

6. The thin film transistor according to claim 1, wherein the conductive region is directly connected with the source electrode and a channel region is between the conductive region and the drain electrode; or
   the conductive region is directly connected with the drain electrode and the channel region is between the conductive region and the source electrode.

7. The thin film transistor according to claim 6, wherein the conductive region is partially overlapped with the drain electrode or the source electrode in the direction perpendicular to the plane in which the active layer is located.

8. The thin film transistor according to claim 1, wherein the thin film transistor is in a top-gate structure or a bottom-gate structure.

9. The thin film transistor according to claim 8, wherein the thin film transistor is in the bottom-gate structure,
   the thin film transistor comprises a back channel etching structure, and
   the concave surface is a surface of the back channel etching structure.

10. The thin film transistor according to claim 1, wherein a material of the active layer is a metal oxide semiconductor material, an amorphous silicon material or a polysilicon material.

11. The thin film transistor according to claim 10, wherein the metal oxide semiconductor material comprises indium gallium zinc oxide, indium zinc oxide, zinc oxide or gallium zinc oxide.

12. An electronic device, comprising the thin film transistor according to claim 1.

13. The electronic device according to claim 12, wherein the electronic device is a liquid crystal display device, an organic light emitting diode display device or an e-paper display device.

14. A manufacturing method of a thin film transistor, comprising:
    forming an active layer, a source electrode, and a drain electrode; and
    performing a conduction treatment on a portion of the active layer to allow the portion to become a conductive region,
    wherein the conductive region is formed between the source electrode and the drain electrode and is spaced apart from at least one of the source electrode and the drain electrode,
    the active layer comprises a concave surface close to a side of the source electrode and the drain electrode, and
    the concave surface is at least partially overlapped with the conductive region in a direction perpendicular to a plane in which the active layer is located.

15. The manufacturing method of the thin film transistor according to claim 14, wherein the conduction treatment comprises:
    forming a mask layer with an opening on the active layer, the opening exposing at least the portion of the active layer; and
    performing the conduction treatment on the active layer using the mask layer.

16. The manufacturing method of the thin film transistor according to claim 15, wherein the opening corresponds to a portion between the source electrode and the drain electrode, and
    the source electrode and the drain electrode are both covered by the mask layer.

17. The manufacturing method of the thin film transistor according to claim 15, wherein the opening exposes only one of the source electrode and the drain electrode.

18. The manufacturing method of the thin film transistor according to claim 15, wherein a source-drain electrode layer is formed after forming the active layer and before the forming the mask layer, and
    the source-drain electrode layer is patterned to form the source electrode and the drain electrode.

19. A manufacturing method of a thin film transistor, comprising:
    forming an active layer, a source electrode, and a drain electrode; and
    performing a conduction treatment on a portion of the active layer to allow the portion to become a conductive region,
    wherein the conductive region is formed between the source electrode and the drain electrode and is spaced apart from at least one of the source electrode and the drain electrode, and the conduction treatment comprises performing a plasma treatment on the active layer.

* * * * *